(12) United States Patent
Song

(10) Patent No.: US 7,948,815 B2
(45) Date of Patent: May 24, 2011

(54) SEMICONDUCTOR MEMORY DEVICE AND RESET CONTROL CIRCUIT OF THE SAME

(75) Inventor: Choung Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 219 days.

(21) Appl. No.: 12/345,807

(22) Filed: Dec. 30, 2008

(65) Prior Publication Data

US 2009/0323442 A1  Dec. 31, 2009

(30) Foreign Application Priority Data

Jun. 30, 2008 (KR) .................. 10-2008-0062914

(51) Int. Cl.
*G11C 7/00* (2006.01)
(52) U.S. Cl. ............... 365/191; 365/233; 365/222
(58) Field of Classification Search .......... 365/191, 365/233, 222, 194, 185.17, 189.03, 185.22, 365/201, 203, 230.06, 189.09, 185.05
See application file for complete search history.

(56) References Cited

U.S. PATENT DOCUMENTS

| 2002/0191467 A1* | 12/2002 | Matsumoto et al. ......... 365/222 |
| 2005/0253638 A1 | 11/2005 | Dietrich et al. |
| 2006/0139985 A1* | 6/2006 | Kanda et al. .................. 365/94 |

FOREIGN PATENT DOCUMENTS

| JP | 2007-251603 A | 9/2007 |
| KR | 100203407 B1 | 3/1999 |
| KR | 1999-26431 A | 4/1999 |
| KR | 1020030050867 A | 6/2003 |

* cited by examiner

*Primary Examiner* — Dang T Nguyen
(74) *Attorney, Agent, or Firm* — Ladas & Parry LLP

(57) ABSTRACT

The semiconductor memory device includes a reset control circuit that monitors a reset signal at an enablement time point of the reset signal input and outputs monitoring signals corresponding to a state of the reset signal. The reset control unit also enables and outputs a reset control signal when the states of the monitoring signals are equal, and ends the monitoring of the reset signal in synchronization with the enablement of the reset control signal. An internal circuit receives the reset control signal, and the reset control signal controls the initialization of the internal circuit. When the reset signal maintains the enablement state for a predetermined period, the reset control signal is enabled, making it possible to prevent reset malfunction associated with a glitch occurring in the reset signal.

25 Claims, 6 Drawing Sheets

SEMICONDUCTOR MEMORY DEVICE AND RESET CONTROL CIRCUIT OF THE SAME

CROSS-REFERENCE TO RELATED APPLICATIONS

The present application claims priority to Korean patent application number 10-2008-0062914 filed on Jun. 30, 2008, which is incorporated herein by reference in its entirety.

BACKGROUND OF THE INVENTION

The present invention relates generally to a semiconductor memory device, and more particularly to a semiconductor memory device including a reset control circuit which controls the reset of an internal circuit.

A reset signal is inputted into a semiconductor memory device to initialize circuit having an operation previously set so as to provide normal operation of an internal circuit of the semiconductor memory device. That is, after the semiconductor memory device is initialized by the reset signal, the semiconductor memory device inputs and outputs data according to a setting of a mode register set and an inputted command.

The semiconductor memory device receives the reset signal from the outside to initialize the data and maintains the initialization state as the reset signal maintains an enablement state for predetermined time. Thereafter, the reset signal is disabled and the command is input, such that the data have a valid value according to the command.

However, during high frequency operation of the semiconductor memory device a significant amount of noise is generated, and as a level of an operation voltage is decreased, a probability of a generation of a glitch in the reset signal is increased.

When the glitch is generated in the reset signal, the glitch causes the reset signal to be instantly enabled, such that the data output may have the initialized value as opposed to the valid data. That is, although the command is input after the glitch occurs in the reset signal, the data maintain the initial value because of the glitch. This results in a problem in that the data value according to the command cannot be processed normally.

This semiconductor memory device cannot determine whether the reset signal is properly enabled to initialize the internal circuit, or enabled due to the glitch. Therefore, there is a problem associated with the semiconductor memory device as described above in that the occurrence of the glitch in the reset signal may result in device malfunction.

SUMMARY OF THE INVENTION

An embodiment of the present invention provides a semiconductor memory device capable of preventing an initialization malfunction of an internal circuit due to a glitch occurring in a reset signal.

The present invention provides a reset control circuit of a semiconductor memory device capable of preventing an enablement of a reset control signal due to a glitch occurring in a reset signal input from the outside, the reset control signal controlling an initialization of an internal circuit.

There is provided a semiconductor memory device according to an embodiment to the present invention comprising: a reset control circuit which monitors a state of a reset signal in synchronization with an enablement time point of the reset signal and outputs monitoring signals corresponding to a state of the reset signal, enables and outputs a reset control signal, wherein the reset control signal is enabled when states of the monitoring signals are equal, and stops the monitoring of the reset signal in synchronization with the enablement of the reset control signal; and an internal circuit receiving the reset control signal, wherein an initialization of the internal circuit is controlled by the reset control signal.

Preferably, the reset control circuit generates an internal clock signal toggled in synchronization with the enablement of the reset signal and outputs the monitoring signals according to the state of the reset signal in synchronization with a toggling of the internal clock signal.

Preferably, the internal clock signal is toggled two or more in number and the reset control signal corresponding to the two or more cycles of the internal clock signal is enabled when states of the monitoring signals are equal.

Preferably, the reset control circuit receives the reset control signal as feedback so as to stop the toggling of the internal clock signal in synchronization with the enablement of the reset control signal.

Preferably, the reset control circuit receives an external clock signal and outputs the monitoring signals according to the state of the reset signal in synchronization with a toggling of the external clock signal.

Preferably, the reset control signal is enabled when states of the monitoring signals corresponding to the two or more cycles of the external clock signal are equal.

Preferably, the reset control circuit receives the reset control signal as feedback so as to initialize the monitoring signals when both the reset signal and the reset control signal are disabled.

Preferably, the reset signal is a signal which an external reset signal input from outside the semiconductor memory device is buffered.

There is provided a reset control circuit of a semiconductor memory device according to the present invention comprising: an oscillator which receives a reset signal and generates an internal clock signal according to the reset signal; a reset signal monitor unit which monitors a state of the reset signal in synchronization with a toggling of the internal clock signal and outputs monitoring signals corresponding to the state of the reset signal; a reset control signal output unit which outputs a reset control signal controlling an initialization of an internal circuit of the semiconductor memory device according to the monitoring signals; and a monitor initialization unit which logically combines the reset signal and the reset control signal to output a monitor initialization signal for initializing the reset signal monitor unit.

Preferably, the oscillator toggles the internal clock signal in synchronization with an enablement of the reset signal Preferably, the oscillator receives the reset control signal as feedback to stop the toggling of the internal clock signal in synchronization with the enablement of the reset control signal.

Preferably, the oscillator toggles the internal clock signal when a state of the reset signal is changed and stops the toggling of the internal clock signal when the state of the reset control signal is changed.

Preferably, the oscillator toggles the internal clock signal when the state of the reset signal is not equal to the state of the reset control signal and stops the toggling of the internal clock signal when the state of the reset signal is equal to the state of the reset control signal.

Preferably, the oscillator has a ring oscillator structure that selectively toggles the internal clock signal according to a logical combination of the reset signal and the reset control signal.

Preferably, the reset signal monitor unit outputs the monitoring signals according to the state of the reset signal in synchronization with edges of the internal clock signal, wherein the edge of the internal clock signal is one of a rising edge or a falling edge.

Preferably, the reset signal monitor unit comprises a shift register, wherein the shift register shifts the state of the reset signal in synchronization with the edges of the internal clock signal and outputs the monitoring signals corresponding to the shifted states.

Preferably, the reset signal monitor unit includes a plurality of serially connected flip flops, the plurality of serially connected flip flops including: a first flip flop which outputs a first enable signal corresponding to the state of the reset signal in synchronization with the edge of the internal clock signal; and a plurality of second flip flops which sequentially output second enable signals corresponding to an output state of the flip flops in a previous stage in synchronization with the edge of the internal clock signal, wherein the first enable signal and the second enable signals correspond to the monitoring signals.

Preferably, the reset control signal output unit enables the reset control signal when states of the monitoring signals are equal.

Preferably, the monitor initialization unit logically combines the reset signal and the reset control signal to determine the enablement of the monitor initialization signal, wherein the monitor initialization signal is enabled when both the reset signal and the reset control signal are equal to a disablement state.

There is provided a reset control circuit of a semiconductor memory device according to an embodiment of the present invention comprising: a reset signal monitor unit which receives an external clock signal and a reset signal and monitors a state of the reset signal in synchronization with the external clock signal and outputs monitoring signals corresponding to the state of the reset signal; a reset control signal output unit which outputs the reset control signal controlling an initialization of an internal circuit of the semiconductor memory device according to the monitoring signals; and a monitor initialization unit which logically combines the reset signal and the reset control signal to output a monitor initialization signal for initializing the reset signal monitor unit.

Preferably, the reset signal monitor unit outputs the monitoring signals according to the reset signal in synchronization with edges of the external clock signal, wherein the edge of the internal clock signal is one of a rising edge or a falling edge.

Preferably, the reset signal monitor unit comprises a shift register, wherein the shift register shifts the state of the reset signal in synchronization with the edges of the external clock signal and outputs the monitoring signals corresponding to the shifted states.

Preferably, the reset signal monitor unit includes a plurality of serially connected flip flops, the plurality of serially connected flip flops including: a first flip flop which outputs a first enable signal corresponding to the state of the reset signal in synchronization with the edge of the external clock signal; and a plurality of second flip flops which sequentially output second enable signals corresponding to an output state of the flip flops in a previous stage in synchronization with and the external clock signal, wherein the first enable signal and the second enable signals correspond to the monitoring signals.

Preferably, the reset control signal output unit enables the reset control signal when states of the monitoring signals are equal.

Preferably, the monitor initialization unit logically combines the reset signal and the reset control signal to enable the monitor initialization signal when both the reset signal and the reset control signal are equal to a disablement state.

An embodiment of the present invention provides the semiconductor memory device initializing the internal circuit only when the reset signal input from the outside maintains the enablement state for a predetermined period, making it possible to prevent the initialization malfunction of the internal circuit due to the glitch occurring in the reset signal.

An embodiment of the present invention provides the reset control circuit of the semiconductor memory device enabling the reset control signal initializing the internal circuit only when the reset signal input from the outside maintains the enablement state for a predetermined period, making it possible to prevent the reset control signal from erroneously enabling due to the glitch occurring in the reset signal.

DESCRIPTION OF SPECIFIC EMBODIMENTS

Hereinafter, preferred embodiments of the present invention will be described in detail with reference to the accompanying drawings.

The present invention discloses a semiconductor memory device that verifies a state of a reset signal input from the outside, and outputs a reset control signal initializing an internal circuit when the reset signal maintains an enablement state for a predetermined period of time.

Figure 1:
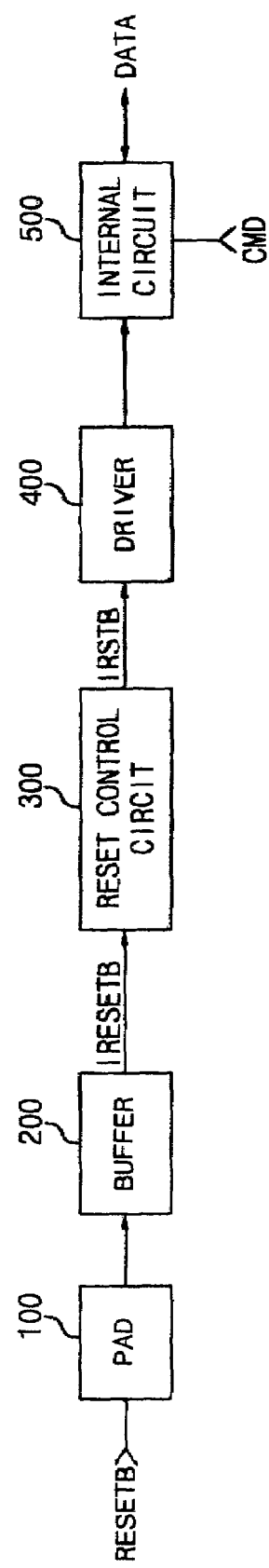
FIG. 1 is a block diagram showing a reset associated circuit of a semiconductor memory device according to an embodiment of the present invention.

Referring to FIG. 1, a semiconductor memory device according to an embodiment of the present invention includes a pad 100, a buffer 200, a reset control circuit 300, an internal circuit 500, and a driver 400, which is positioned between the reset control circuit 300 and the internal circuit 500.

The buffer 200 buffers a reset signal RESETB inputted through the pad 100 and outputs an internal reset signal IRESETB.

The reset control circuit 300 uses the internal reset signal IRESETB to output a reset control signal IRSTB. That is, the reset control circuit 300 determines the state of the internal reset signal IRESETB and enables the reset control signal IRSTB when the internal reset signal IRESETB maintains an enablement state for a predetermined period of time.

The driver 400 drives the reset control signal IRSTB and provides the driven signal to the internal circuit 500.

The internal circuit 500 processes data DATA in response to a command signal CMD. The initialization of the internal circuit 500 is controlled according to the driven signal output from the driver 400.

Figure 2:
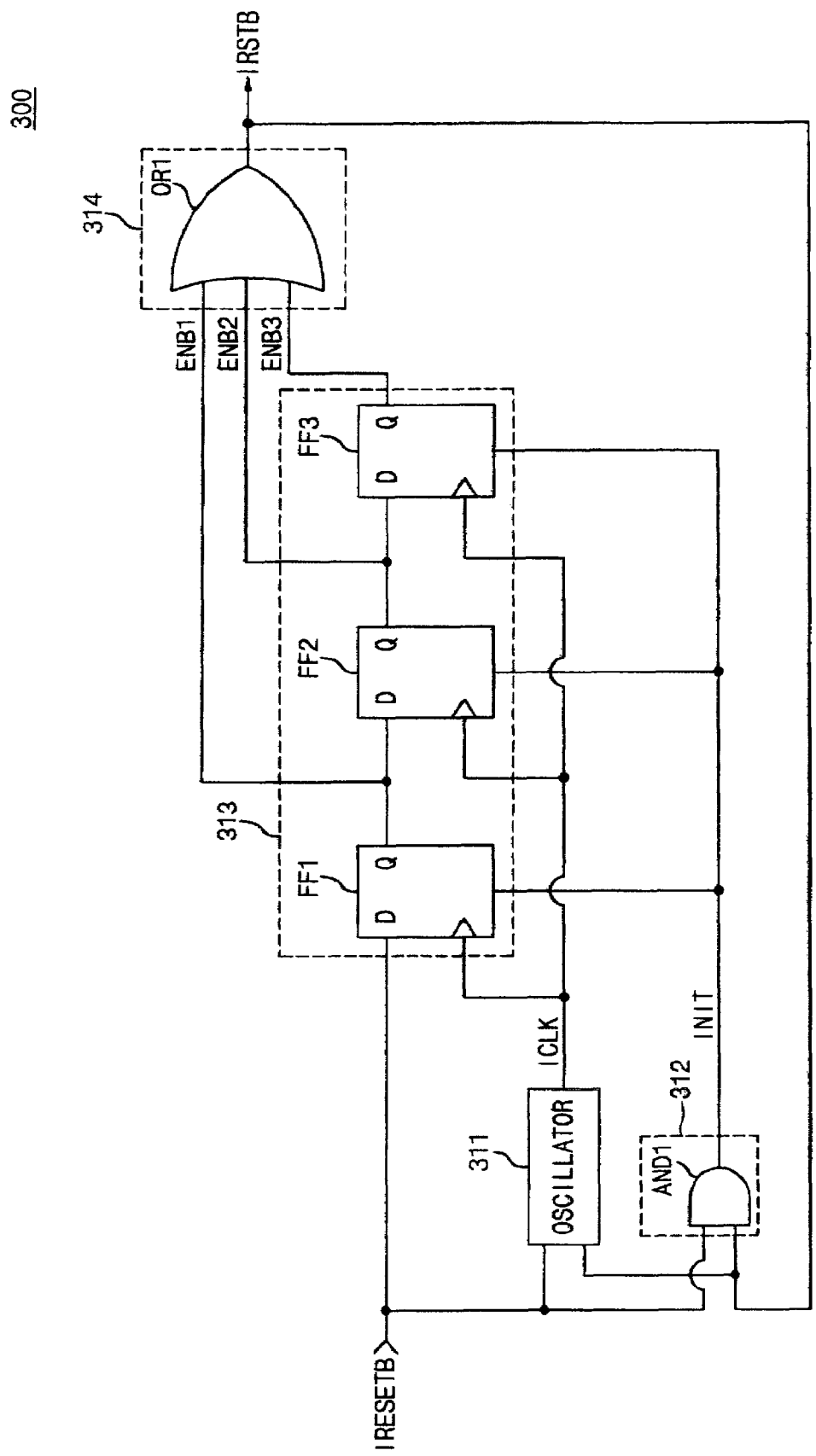
FIG. 2 is a circuit diagram showing an embodiment of the reset control circuit 300 of FIG. 1.

FIG. 2 shows the configuration of the reset control circuit 300 according to an embodiment of the present invention.

Referring to FIG. 2, the reset control circuit 300 includes an oscillator 311 and a reset determination unit. The reset determination unit may include a monitor initialization unit 312, a reset signal monitor unit 313, and a reset control signal output unit 314.

The oscillator 311 receives the internal reset signal IRESETB and the reset control signal IRSTB and outputs an internal clock signal ICLK. The internal clock signal is toggled when the internal reset signal IRESETB is enabled at a low level. The toggling of the internal clock signal ICLK stops when the reset control signal IRSTB is enabled at a low level.

Figure 3:
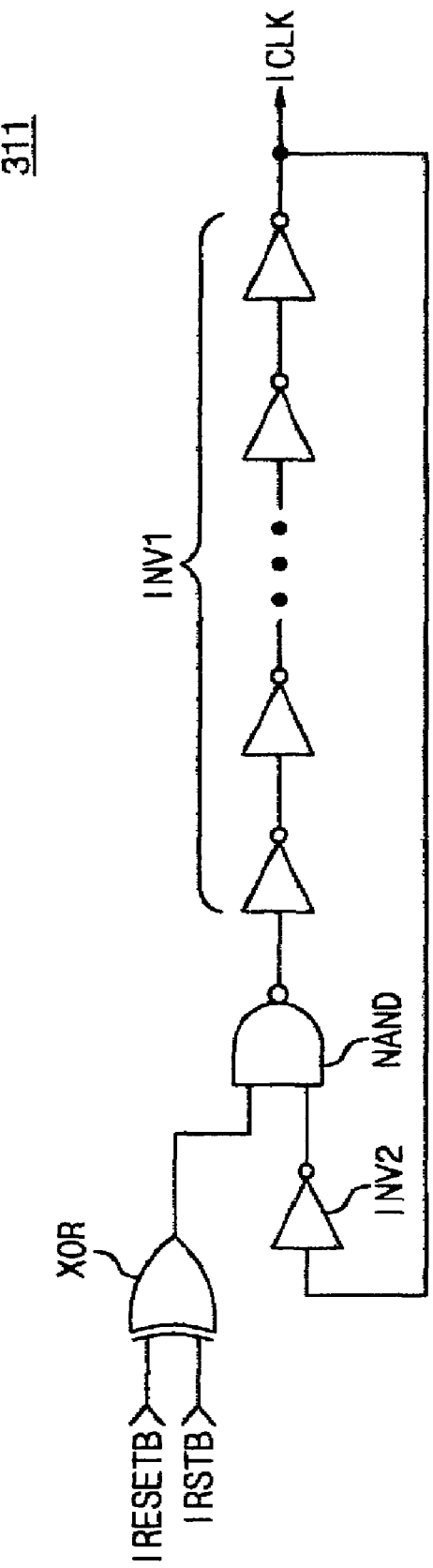
FIG. 3 is a circuit diagram showing a configuration of the oscillator 311 of FIG. 2.

As shown in FIG. 3, the oscillator 311 may be formed in a ring oscillator structure by way of example.

Referring to FIG. 3, the oscillator 311 may include an exclusive OR gate XOR which logically XOR combines the internal reset signal IRESETB and the reset control signal IRSTB, a NAND gate NAND which logically NAND combines the output from the exclusive-OR gate XOR and the output from an inverter INV2, which will be described in detail below, a plurality of inverters INV1 serially connected between the output terminal of the NAND gate NAND and the inverter INV2, which inverts an output ICLK from the plurality of inverters INV1. Preferably, the plurality of inverters INV1 is configured to include an odd number of inverters.

The oscillator 311, configured as shown in FIG. 3, toggles the internal clock signal ICLK when the logic level of the internal reset signal IRESETB is changed and stops the toggling of the internal clock signal ICLK (i.e. disables the internal clock signal ICLK) when the logic level of the reset control signal IRSTB is changed.

That is, the oscillator 311 toggles the internal clock signal ICLK when the logic level of the internal reset signal IRESETB and the logic level of the reset control signal IRSTB are not equal and disables the internal clock signal ICLK when the logic level of the internal reset signal IRESETB and the logic level of the reset control signal IRSTB are equal.

Referring again to FIG. 2, the monitor initialization unit 312 logically combines the internal reset signal IRESETB and the reset control signal IRSTB to output a monitor initialization signal INIT for initializing the reset signal monitor unit 313. The monitor initialization unit 312 enables the monitor initialization signal INIT when both the internal reset signal IRESETB and the reset control signal IRSTB disabled.

The monitor initialization unit 312 may, for example, include an AND gate AND1, which logically AND combines the internal reset signal IRESETB and the reset control signal IRSTB so as to output the monitor initialization signal INIT. That is, the monitor initialization unit 312 enables the monitor initialization signal INIT at a high level when both the internal reset signal IRESETB and the reset control signal IRSTB are disabled at the high level.

The reset signal monitor unit 313 monitors a state of the internal reset signal IRESETB in synchronization with the internal clock signal ICLK and outputs monitoring signals as a plurality of enable signals ENB1 to ENB3.

The reset signal monitor unit 313 of the present invention may include counter, shift register, and/or latch. For example, according to an embodiment of the present invention as shown in FIG. 2, the reset signal monitor unit 313 may include a D-flip flop FF1, which outputs an enable signal ENB1 corresponding to the state of the internal reset signal IRESETB in synchronization with an edge of the internal clock signal ICLK, a D-flip flop FF2, which outputs an enable signal ENB2 corresponding to the state of the enable signal ENB1 in synchronization with an edge of the internal clock signal ICLK, and a D-flip flop FF3 which, outputs an enable signal ENB3 corresponding to the state of the enable signal ENB2 in synchronization with an edge of the internal clock signal CLK. Preferably, the D-flip flops FF1 to FF3 are operated in a rising edge trigger scheme.

The reset control signal output unit 314 logically combines the plurality of enable signals ENB1 to ENB3 to output the internal reset signal IRSTB. The reset control signal output unit 314 enables the internal reset signal IRSTB when all the monitoring signals correspond to the enablement state of the internal reset signal IRESETB (i.e. all the enable signals ENB1 to ENB3 are enabled at the low level).

According to an embodiment of the present invention as shown in FIG. 2, the reset control signal output unit 314 may include an OR gate OR1 which logically OR combines the enable signals ENB1 to ENB3 to output the reset control signal IRSTB. That is, when the enable signals ENB1 to ENB3 are all enabled at the low level the reset control signal IRSTB is then enabled at the low level.

Figure 4:
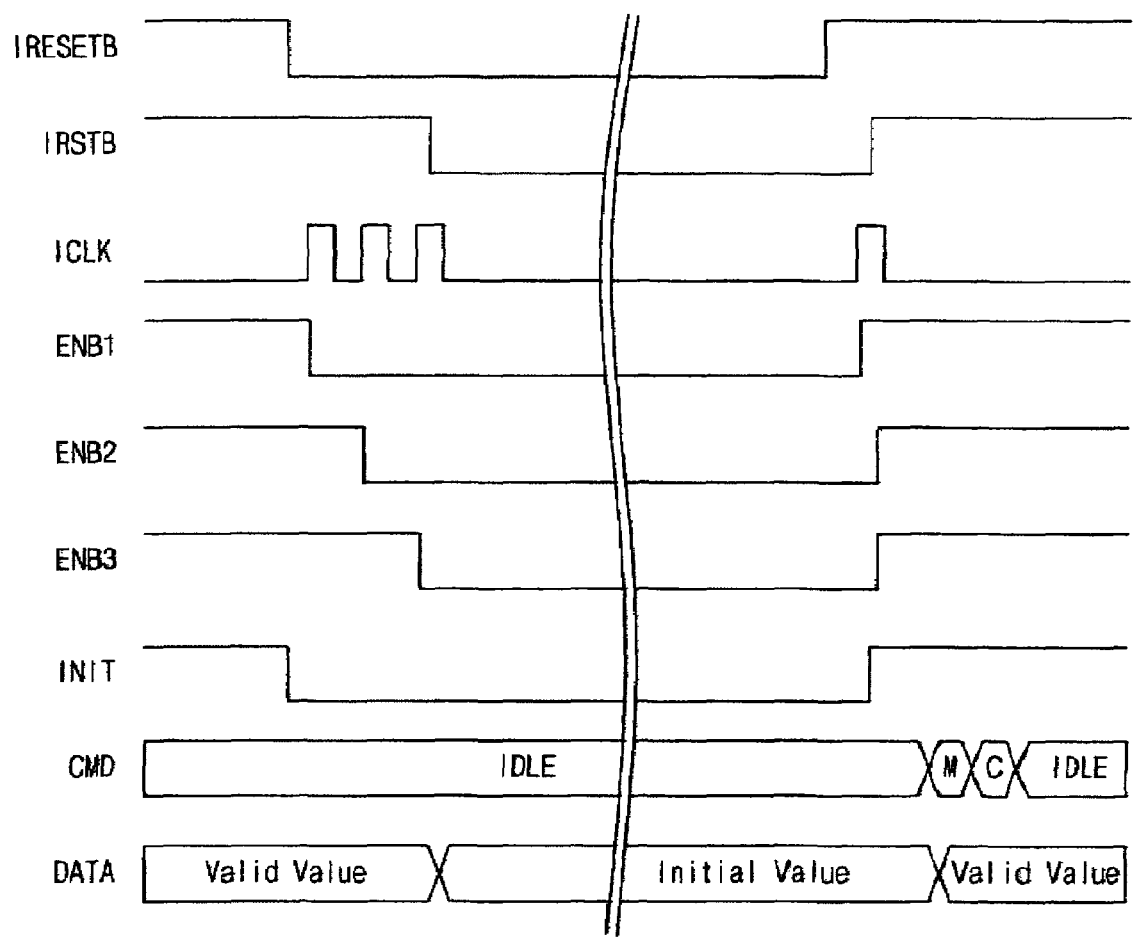
FIG. 4 is a waveform diagram of a reset operation of a semiconductor memory device according to an embodiment of the present invention when a reset signal is normally input.

The operation of the semiconductor memory device according to the present invention including the reset control circuit 300 configured as shown FIG. 2 will be described with reference to FIG. 4.

First, in when the internal reset signal IRESETB is disabled at a high level, the monitor initialization signal INIT maintains an enablement state at a high level. Therefore, the reset signal monitor unit 313 is maintained at an initialization state.

When the internal reset signal IRESETB is enabled at a low level, the monitor initialization signal INIT is disabled at a low level and the toggling of the internal clock signal ICLK starts. When the internal clock ICLK begins to toggle, the enable signals ENB1 to ENB3 are sequentially enabled at a low level in synchronization with the rising edge of the internal clock signal ICLK.

When all the enable signals ENB1 to ENB3 are enabled at the low level, the reset control signal IRSTB is enabled at a low level and the data DATA has an initialization value accordingly. Further, when all the enable signals ENB1 to ENB3 are enabled at the low level, such that the reset control signal IRSTB is enabled at a low level, the internal clock signal ICLK is disabled at a low level.

Thereafter, when the internal reset signal IRESETB is transitioned to the high level and therefore disabled, the internal clock signal ICLK is toggled once and the enable signal ENB1 is disabled at the high level in synchronization with the rising edge of the internal clock signal ICLK.

When the enable signal ENB1 is disabled at the high level, the reset control signal IRSTB is then disabled at the high level, the internal clock signal ICLK is disabled (i.e. the toggling of the internal clock signal ICLK is stopped), and the monitor initialization signal INIT is enabled at a high level such that the reset signal monitor unit 313 is initialized resulting in all of the enable signals ENB1 to ENB3 being disabled at the high level.

When the command signal CMD is sequentially input as 'M (MRS)' and 'C (Command, for example, read or write)' commands, the data DATA has a valid value according to the command.

Figure 5:
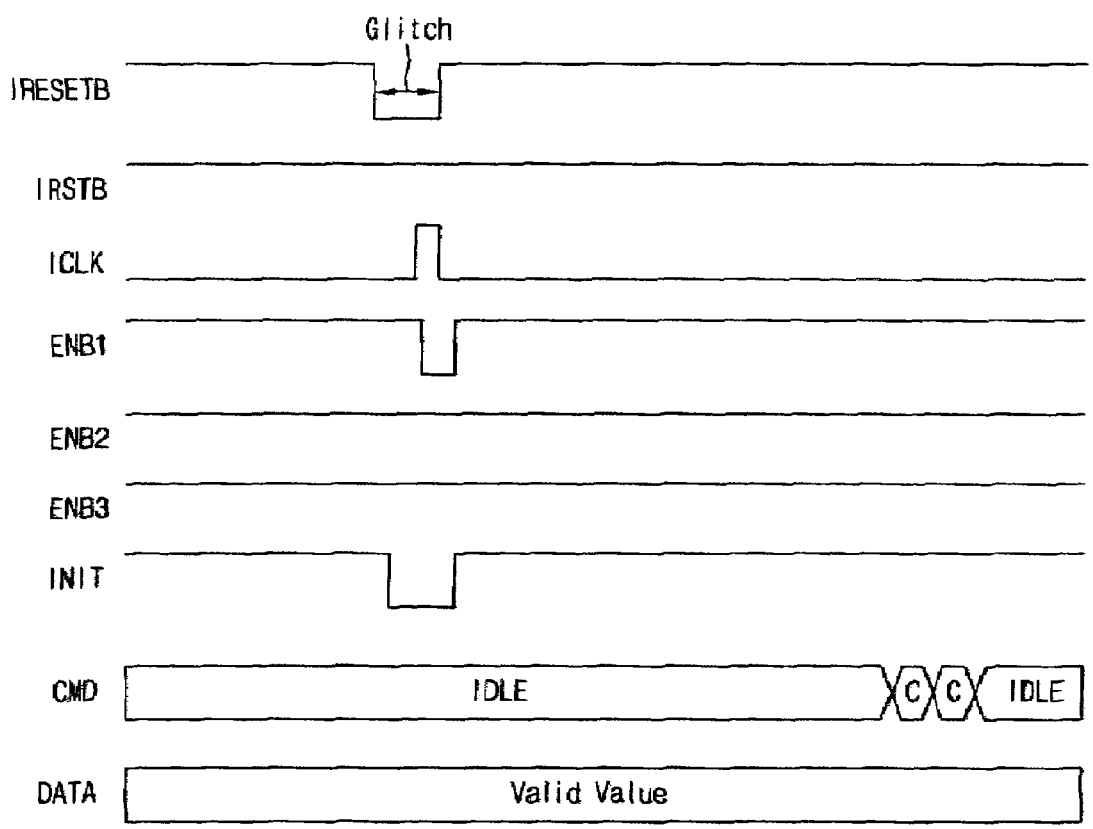
FIG. 5 is a waveform diagram showing a reset preventing operation of a semiconductor memory device according to an embodiment of the present invention when a glitch occurs in the reset signal.

FIG. 5 is a waveform diagram showing the operation of the semiconductor memory device according to an embodiment of the present invention when a glitch occurs in the internal reset signal IRESETB.

When the internal reset signal IRESETB is enabled at low level for a period of time corresponding to the glitch occurring in the internal reset signal IRESETB, the internal clock signal ICLK is toggled only once such that only the enable signal ENB1 is enabled at a low level Therefore, since the internal clock signal ICLK is toggled only once, none of the remaining enable signals ENB2 to ENB3 is enabled at the low level when the glitch occurs in the internal reset signal IRESETB.

That is, even when the internal reset signal IRESETB is enabled at the low level for a period of time corresponding to the glitch, the internal clock signal ICLK is not toggled more than one time, and therefore the glitch does not result in the enabling of the remaining enable signals ENB2, ENB3.

Therefore, when a glitch occurs, the reset control signal IRSTB maintains a disablement state at the high level and thus, even during the occurrence of a glitch in the internal reset signal IRESETB the data DATA is normally maintained at the valid value. That is, when a glitch occurs in the internal reset signal IRESETB, the reset control signal IRSTB is maintained at the disablement state and therefore the data will not be replaced with the initialization value.

Figure 6:
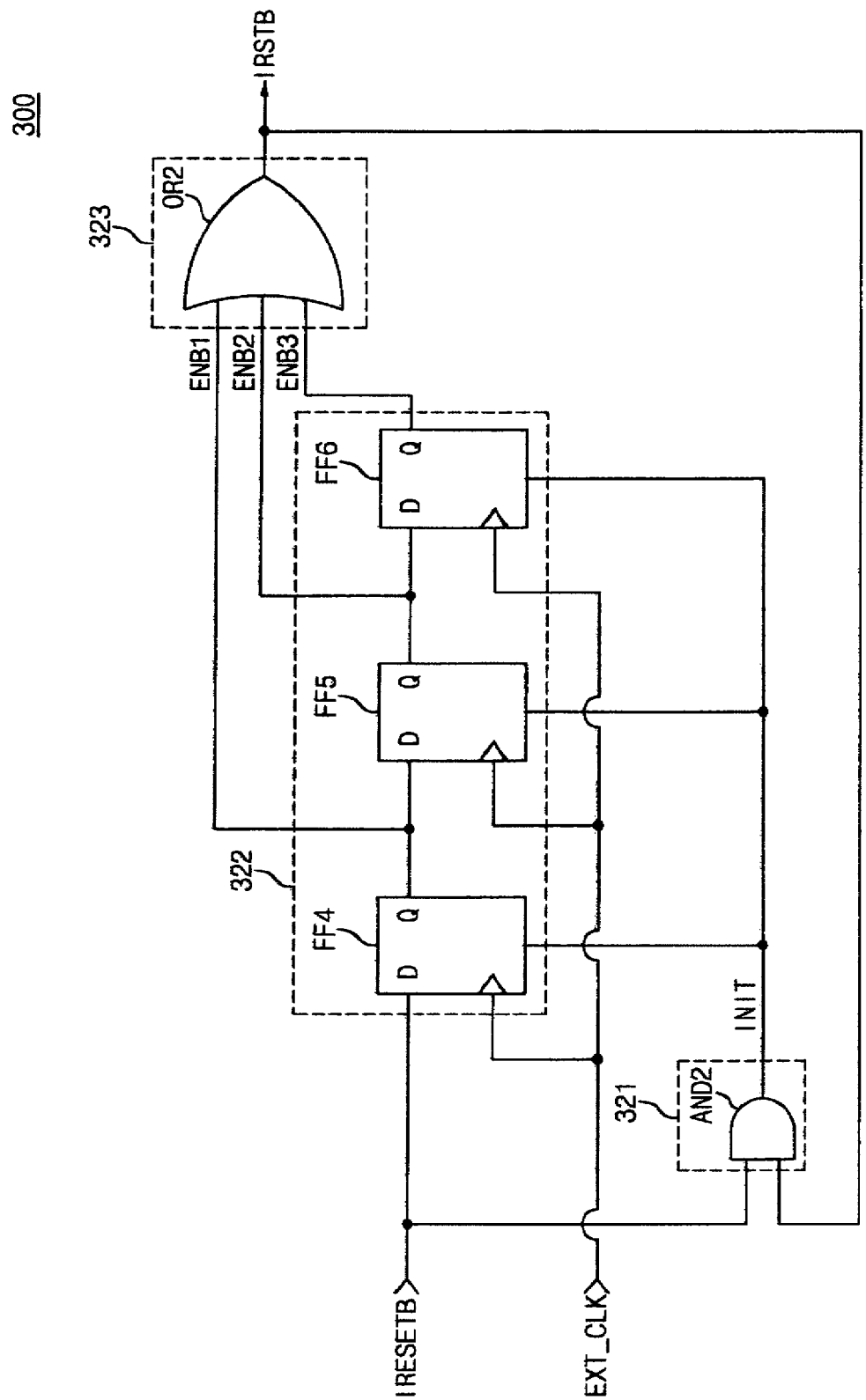
FIG. 6 is a circuit diagram showing another embodiment of the reset control circuit 300 of FIG. 1.

FIG. 6 shows a configuration of the reset control circuit 300 according to another embodiment.

Referring to FIG. 6, the reset control circuit 300 may include a monitor initialization unit 321, a reset signal monitor unit 322, and a reset control signal output unit 323.

The monitor initialization unit 321 combines the internal reset signal IRESETB and the reset control signal IRSTB to output the monitor initialization signal INIT, which initializes the reset signal monitor unit 322. The monitor initialization unit 321 enables the monitor initialization signal INIT when both the internal reset signal IRESETB and the reset control signal IRSTB are disabled.

According to an embodiment of the present invention, the monitor initialization unit 321, as shown in FIG. 6, may include an AND gate AND2 which logically AND combines the internal reset signal IRESETB and the reset control signal IRSTB to output the monitor initialization signal INIT. When both the internal reset signal IRESETB and the reset control signal IRSTB are disabled at the high level, the monitor initialization signal INIT is enabled at the high level.

The reset signal monitor unit 322 monitors a state of the internal reset signal IRESETB in synchronization with an external clock signal EXT_CLK and outputs monitoring signals as a plurality of enable signals ENB1 to ENB3.

The reset signal monitor unit 322 may include counter, shift register, and/or latch. For example, according to the present embodiment as shown in FIG. 6, the reset signal monitor unit 322 may include a D-flip flop FF4, which outputs the enable signal ENB1 corresponding to the state of the internal reset signal IRESETB in synchronization with an edge of an external clock signal EXT_CLK, a D-flip flop FF5, which outputs the enable signal ENB5 corresponding to the state of the enable signal ENB4 in synchronization with an edge of the external clock signal EXT_CLK, and a D-flip flop FF6, which outputs the enable signal ENB3 corresponding to the state of the enable signal ENB2 in synchronization with an edge of the external clock signal EXT_CLK. Preferably, the D-flip flops FF4 to FF6 are operated in the rising edge trigger scheme.

The reset control signal output unit 323 combines the enable signals ENB1 to ENB3 to output the internal reset signal IRSTB. That is, the reset control signal output unit 323 enables the internal reset signal IRSTB when all the monitoring signals correspond to the enablement state of the internal reset signal IRESETB (i.e. all the enable signals ENB1 to ENB3 is enabled at the low level).

The control signal output unit 323 according to the present embodiment may include an OR gate OR2 that logically OR combines the enable signals ENB1 to ENB3 to output the reset control signal IRSTB.

The reset control circuit 300, configured as shown in FIG. 6, sequentially enables the enable signals ENB1 to ENB3 when the internal reset signal IRESETB maintains an enablement state at the low level during a period of time while the external clock signal EXT_CLK toggles three times (the number of clock toggles being determined according to the number of enable signals ENB1 to ENB3) and all of the enable signals ENB1 to ENB3 are enabled at the low level, and therefore enables the reset control signal IRSTB at the low level.

Therefore, even when the internal reset signal IRESETB is enabled as the result of a glitch occurring in the internal reset signal IRESETB, not all of the enable signals ENB1 to ENB3 are enabled, and therefore the reset control signal IRSTB is maintained at the disablement state.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device comprising:
a reset control circuit:
monitoring a state of a reset signal in synchronization with an enablement time point of the reset signal and outputting monitoring signals corresponding to a state of the reset signal,
enabling and outputting a reset control signal, wherein the reset control signal is enabled when states of the monitoring signals are equal, and
stopping the monitoring of the reset signal in synchronization with the enablement of the reset control signal; and
an internal circuit receiving the reset control signal, wherein an initialization of the internal circuit is controlled by the reset control signal.

2. The semiconductor memory device as set forth in claim 1, wherein the reset control circuit generates an internal clock signal toggled in synchronization with the enablement of the reset signal and outputs the monitoring signals according to the state of the reset signal in synchronization with a toggling of the internal clock signal.

3. The semiconductor memory device as set forth in claim 2, wherein the internal clock signal is toggled two or more in number and the reset control signal is enabled when states of the monitoring signals corresponding to the toggling of the internal clock signal are equal.

4. The semiconductor memory device as set forth in claim 3, wherein the reset control circuit receives the reset control signal as feedback so as to stop the toggling of the internal clock signal in synchronization with the enablement of the reset control signal.

5. The semiconductor memory device as set forth in claim 1, wherein the reset control circuit receives an external clock signal and outputs the monitoring signals according to the state of the reset signal in synchronization with a toggling of the external clock signal.

6. The semiconductor memory device as set forth in claim 5, wherein the reset control signal is enabled when states of the monitoring signals corresponding to the two or more toggling of the external clock signal are equal.

7. The semiconductor memory device as set forth in claim 1, wherein the reset control circuit receives the reset control signal as feedback so as to initialize the monitoring signals when both the reset signal and the reset control signal are disabled.

8. The semiconductor memory device as set forth in claim 1, wherein the reset signal is a signal which an external reset signal input from outside the semiconductor memory device is buffered.

9. A reset control circuit of a semiconductor memory device comprising:
- an oscillator receiving a reset signal and generating an internal clock signal according to the reset signal;
- a reset signal monitor unit monitoring a state of the reset signal in synchronization with a toggling of the internal clock signal and outputting monitoring signals corresponding to the state of the reset signal;
- a reset control signal output unit outputting a reset control signal controlling an initialization of an internal circuit of the semiconductor memory device according to the monitoring signals; and
- a monitor initialization unit logically combining the reset signal and the reset control signal to output a monitor initialization signal for initializing the reset signal monitor unit.

10. The reset control circuit of the semiconductor memory device as set forth in claim 9, wherein the oscillator toggles the internal clock signal in synchronization with an enablement of the reset signal.

11. The reset control circuit of the semiconductor memory device as set forth in claim 10, wherein the oscillator receives the reset control signal as feedback to stop the toggling of the internal clock signal in synchronization with the enablement of the reset control signal.

12. The reset control circuit of the semiconductor memory device as set forth in claim 11, wherein the oscillator toggles the internal clock signal when a state of the reset signal is changed and stops the toggling of the internal clock signal when the state of the reset control signal is changed.

13. The reset control circuit of the semiconductor memory device as set forth in claim 11, wherein the oscillator toggles the internal clock signal when the state of the reset signal is not equal to the state of the reset control signal and stops the toggling of the internal clock signal when the state of the reset signal is equal to the state of the reset control signal.

14. The reset control circuit of the semiconductor memory device as set forth in claim 10, wherein the oscillator has a ring oscillator structure that selectively toggles the internal clock signal according to a logical combination of the reset signal and the reset control signal.

15. The reset control circuit of the semiconductor memory device as set forth in claim 9, wherein the reset signal monitor unit outputs the monitoring signals according to the state of the reset signal in synchronization with edges of the internal clock signal, wherein the edge of the internal clock signal is one of a rising edge or a falling edge.

16. The reset control circuit of the semiconductor memory device as set forth in claim 15, wherein the reset signal monitor unit comprises a shift register, wherein the shift register shifts the state of the reset signal in synchronization with the edges of the internal clock signal and outputs the monitoring signals corresponding to the shifted states by the shift register.

17. The reset control circuit of the semiconductor memory device as set forth in claim 15, wherein the reset signal monitor unit comprises:
- a plurality of serially connected flip flops, the plurality of serially connected flip flops comprising:
  - a first flip flop outputting a first enable signal corresponding to the state of the reset signal in synchronization with the edge of the internal clock signal; and
  - a plurality of second flip flops sequentially outputting second enable signals corresponding to an output state of the flip flops in a previous stage in synchronization with the edge of the internal clock signal,
  - wherein the first and the second enable signals correspond to the monitoring signals.

18. The reset control circuit of the semiconductor memory device as set forth in claim 9, wherein the reset control signal output unit enables the reset control signal when states of the monitoring signals are equal.

19. The reset control circuit of the semiconductor memory device as set forth in claim 9, wherein the monitor initialization unit logically combines the reset signal and the reset control signal to determine the enablement of the monitor initialization signal, wherein the monitor initialization signal is enabled when both the reset signal and the reset control signal are equal to a disablement state.

20. A reset control circuit of a semiconductor memory device comprising:
- a reset signal monitor unit receiving an external clock signal and a reset signal and monitoring a state of the reset signal in synchronization with the external clock signal and outputting monitoring signals corresponding to the state of the reset signal;
- a reset control signal output unit outputting the reset control signal controlling an initialization of an internal circuit of the semiconductor memory device according to the monitoring signals; and
- a monitor initialization unit logically combining the reset signal and the reset control signal to output a monitor initialization signal for initializing the reset signal monitor unit.

21. The reset control circuit of the semiconductor memory device as set forth in claim 20, wherein the reset signal monitor unit outputs the monitoring signals according to the reset signal in synchronization with edges of the external clock signal, wherein the edge of the internal clock signal is one of a rising edge or a failing edge.

22. The reset control circuit of the semiconductor memory device as set forth in claim 21, wherein the reset signal monitor unit comprises a shift register, wherein the shift register shifts the state of the reset signal in synchronization with the edges of the external clock signal and the monitoring signals corresponds to the shifted states by the shift register.

23. The reset control circuit of the semiconductor memory device as set forth in claim 21, wherein the reset signal monitor unit comprises a plurality of serially connected flip flops, the plurality of serially connected flip flops comprising:
- a first flip flop outputting a first enable signal corresponding to the state of the reset signal in synchronization with the edge of the external clock signal; and
- a plurality of second flip flops sequentially outputting second enable signals corresponding to an output state of the flip flops in a previous stage in synchronization with the edge of the external clock signal,
- wherein the first and the second enable signals correspond to the monitoring signals.

24. The reset control circuit of the semiconductor memory device as set forth in claim 20, wherein the reset control signal output unit enables the reset control signal when states of the monitoring signals are equal.

25. The reset control circuit of the semiconductor memory device as set forth in claim 20, wherein the monitor initialization unit logically combines the reset signal and the reset control signal to enable the monitor initialization signal when both the reset signal and the reset control signal are equal to a disablement state.

* * * * *